United States Patent [19]

Takaoka

[11] Patent Number: 5,718,812
[45] Date of Patent: Feb. 17, 1998

[54] MAGNETIC HEAD MANUFACTURING METHOD USING SPUTTERING APPARATUS

[75] Inventor: Satoshi Takaoka, Saitama-ken, Japan

[73] Assignee: Canon Kabushiki Kaisha, Tokyo, Japan

[21] Appl. No.: 747,987

[22] Filed: Nov. 12, 1996

Related U.S. Application Data

[63] Continuation of Ser. No. 124,343, Sep. 20, 1993, abandoned.

[30] Foreign Application Priority Data

Sep. 25, 1992 [JP] Japan .................................. 4-256569

[51] Int. Cl.⁶ .................................................. C23C 14/34
[52] U.S. Cl. ................................. 204/192.2; 204/192.15
[58] Field of Search .......................... 204/192.12, 792.15,
204/192.2, 192.23, 192.16, 192.22, 298.15,
298.23, 298.26, 298.27, 298.28

[56] References Cited

U.S. PATENT DOCUMENTS

| | | | |
|---|---|---|---|
| 4,288,307 | 9/1981 | Wasa et al. | 204/192.2 |
| 4,767,516 | 8/1988 | Nakatsuka et al. | 204/298.26 |
| 5,000,834 | 3/1991 | Yoshikawa | 204/192.2 |
| 5,328,583 | 7/1994 | Kameyama et al. | 204/298.26 |

FOREIGN PATENT DOCUMENTS

| | | | |
|---|---|---|---|
| 60-218820 | 11/1985 | Japan | 204/192.2 |
| 60-218821 | 11/1985 | Japan | 204/192.2 |
| 1-319671 | 12/1989 | Japan | 204/298.26 |
| 3-001309 | 1/1991 | Japan | 204/192.2 |

*Primary Examiner*—R. Bruce Breneman
*Assistant Examiner*—Rodney G. McDonald
*Attorney, Agent, or Firm*—Robin, Blecker, Daley and Driscoll

[57] ABSTRACT

A method of manufacturing a magnetic head in which magnetic metal thin films are respectively formed on opposed faces of a pair of magnetic core halves made of a magnetic oxide and abut against each other across a magnetic gap, includes the steps of preparing an opposed-target type sputtering apparatus, holding a magnetic oxide block on a holding member, and forming, while rotating the holding member, the magnetic metal thin film on an end face of the magnetic oxide block which constitutes one of the opposed faces, in an argon gas containing any one of nitrogen, oxygen and carbon dioxide. A direction of rotation of the holding member is made substantially coincident with a track-width direction of the opposed face.

7 Claims, 6 Drawing Sheets

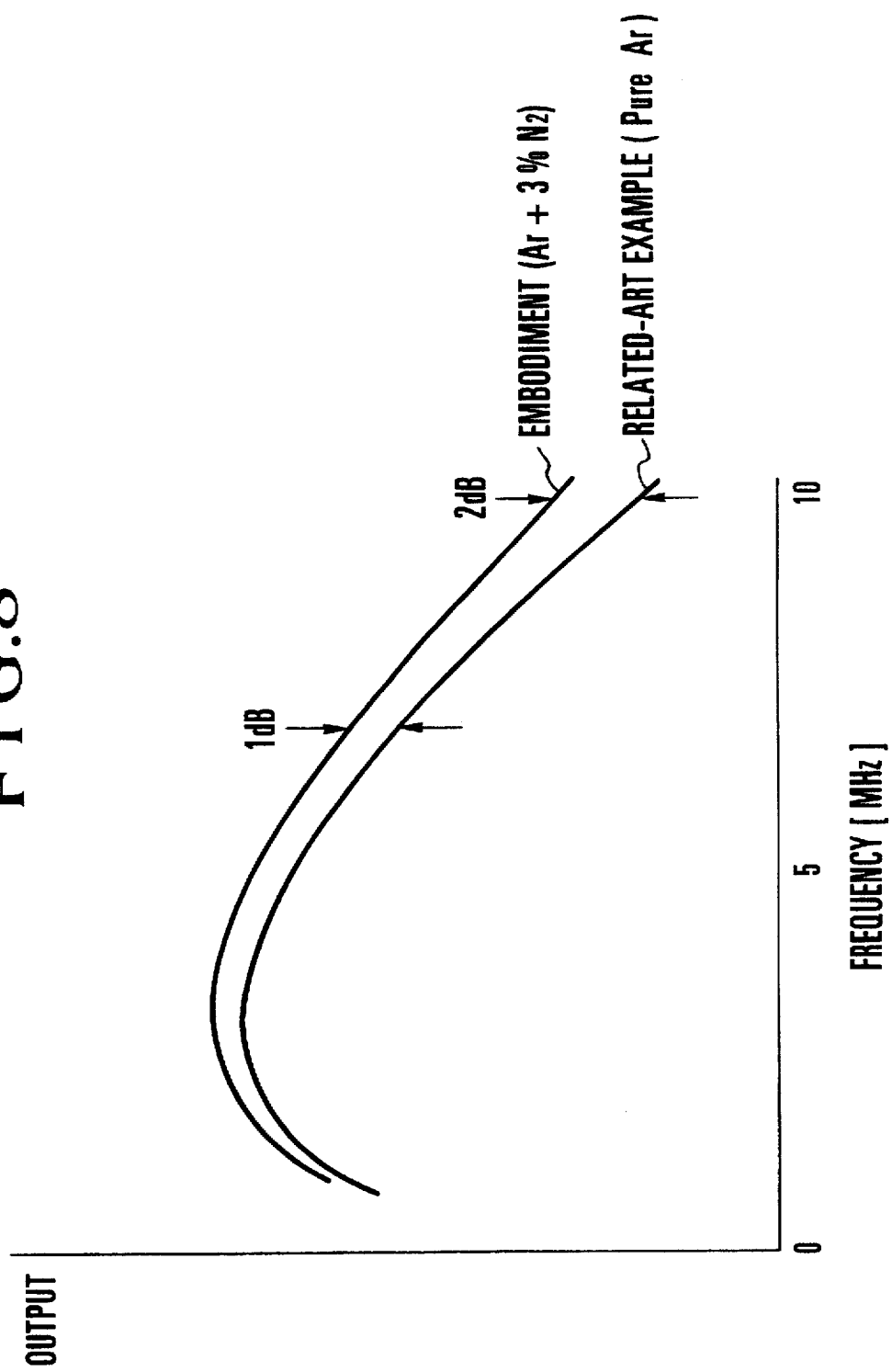

MAGNETIC HEAD MANUFACTURING METHOD USING SPUTTERING APPARATUS

This is a continuation application under 37 CFR 1.62 of prior application Ser. No. 08/124,343 filed on Sep. 20, 1993 now abandoned.

BACKGROUND OF THE INVENTION

1. Field of the Invention

The present invention relates to a method of manufacturing a magnetic head for performing magnetic recording or reproduction of information while keeping a magnetic core in sliding contact with a magnetic recording medium and, more particularly, to a magnetic head in which magnetic metal thin films are respectively formed on opposed faces of a pair of magnetic core halves made of a magnetic oxide and abut against each other across a magnetic gap.

2. Description of the Related Art

In recent years, it has been strongly demanded to increase the saturation magnetic flux density of the magnetic core of a magnetic head for use in a VTR (video tape recorder) or a DAT (digital audio tape recorder) to realize a further increase in the recording density of the magnetic head. To meet this demand, a so-called MIG (metal-in-gap) type of magnetic head is adopted which includes a magnetic core having abutment faces, i.e., faces opposed to each other across a magnetic gap, on each of which is formed a magnetic metal thin film of high saturation magnetic flux density, such as a thin film of a Fe-Al-Si based alloy, known by the trademark name, SENDUST, or an amorphous magnetic alloy.

FIGS. 1 and 2 show one example of the structure of the magnetic core of the MIG type of magnetic head. FIG. 1 is a diagrammatic perspective view of the magnetic core of the MIG type of magnetic head, and FIG. 2 is a diagrammatic plan view showing the slide face of the magnetic core which is to be placed in sliding contact with a magnetic recording medium.

Referring to FIGS. 1 and 2, magnetic core halves 2 and 2', each of which is primarily made of a magnetic oxide such as ferrite, are opposed to each other across a magnetic gap 6 and bonded to each other by glass welding using a low melting temperature glass 8, thereby constituting a magnetic core.

The abutment faces of the magnetic core halves 2 and 2' are partially formed as track grooves 4 which serve to define the track width of the magnetic gap 6, and magnetic metal thin films 3 are respectively formed on the abutment faces each of which is partially formed as the track groove 4. A thin film of a magnetic gap material 9 is formed on each of the magnetic metal thin films 3 to form the magnetic gap 6. The track grooves 4 are filled with the low melting temperature glass 8.

A coil winding (not shown) is wound around the magnetic core through an opening defined by winding grooves 7 which are respectively formed in the magnetic core halves 2 and 2'. The magnetic head has the above-described arrangement.

A related-art method of manufacturing the magnetic core of the magnetic head shown in FIGS. 1 and 2 will be described below with reference to FIGS. 3(A), 3(B) and 3(C).

Referring to FIG. 3(A), a ferrite plate (block) 1 is prepared as a core material from which to cut out the aforesaid magnetic core half 2 or 2'. A plurality of track grooves 4 are formed in one side of the ferrite plate 1 so that each abutment face 1a is defined to have a track width T. Abutment faces 1a respectively constitute the abutment faces of either of the magnetic core halves 2 and 2' which are to be opposed to each other across the magnetic gap 6 (refer to FIG. 1). The winding groove 7 is formed in the side of the ferrite plate 1 in which the track grooves 4 are formed, so that the coil winding can be wound around the magnetic core through the opening defined by the winding grooves 7. In the following description, since the direction indicated by an arrow 11 in FIG. 3(A) corresponds to the width direction of each track formed by a finished magnetic head, such direction will be referred to simply as the "track-width direction", while the direction indicated by an arrow 12 in FIG. 3(A) will be referred to simply as the "depth direction" since such direction corresponds to the depth direction of the gap of the finished magnetic head.

Then, as shown in FIG. 3(B), the magnetic metal thin film 3, such as a thin film of a Fe-Al-Si based alloy, is formed over the entire face of the ferrite plate 1 on which the abutment faces 1a are formed, by a vacuum thin-film formation technique such as sputtering. The magnetic gap material 9 is formed on the magnetic metal thin film 3 by a similar vacuum thin-film formation technique.

Then, as shown in FIG. 3(C), the ferrite plate 1 and a similar ferrite plate 1' are prepared. The ferrite plates 1 and 1' are combined so that the track defining portions of their respective magnetic gap materials 9 abut against each other. Then, the low melting temperature glass 8 is charged into each of the track grooves 4, and the ferrite plates 1 and 1' are bonded to each other by glass welding using the low melting temperature glass 8. Then, one face of the bonded assembly of the ferrite plates 1 and 1', i.e., the left one of the faces shown as visible faces in FIG. 3(C), is cut into a face of cylindrical form which serves as a slide face 10 for providing sliding contact with a magnetic recording medium. Then, the bonded assembly of the ferrite plates 1 and 1' is cut along the cutting lines indicated by A—A' and B—B' at a pitch equivalent to a predetermined core width W, whereby the magnetic core shown in FIGS. 1 and 2 is obtained.

In the step of forming the aforesaid magnetic metal thin film 3, an opposed-target type sputtering apparatus is employed. FIG. 4 schematically shows one example of the opposed-target type sputtering apparatus. As shown in FIG. 4, a pair of targets 15a and 15b made of a magnetic metal material, such as a Fe-Al-Si based alloy, are opposed to each other. Permanent magnets 17 are disposed adjacent to the target 15a with the north-pole sides of the respective permanent magnets 17 opposed to the reverse side of the target 15a, while permanent magnets 18 are disposed adjacent to the target 15b with the south-pole sides of the respective permanent magnets 18 opposed to the reverse side of the target 15b. A substrate holder 13 is provided for holding a ferrite substrate on which the magnetic metal material, such as the Fe-Al-Si based alloy, is to be formed as a film.

In the above-described arrangement, since a magnetic field for plasma focusing is applied to the targets 15a and 15b in the direction perpendicular thereto, even a magnetic metal material of high saturation magnetic flux density, such as the Fe-Al-Si based alloy, can be sputtered stably and at a fast film-forming speed, so that high productivity can be realized. Incidentally, a pure Ar gas is employed as a gas for sputtering.

However, if the above-described magnetic metal thin film, for example, a Fe-Al-Si based alloy thin film, is formed, magnetic anisotropy occurs, so that a variation in effective permeability occurs according to the direction in which the magnetic field is applied to the formed thin film.

For example, in a case where the ferrite plate 1 is disposed in such a manner that a track-width direction 11 of the ferrite plate 1 coincides with a diametrical direction 14 of the substrate holder 13 as shown in FIG. 5, if film formation is performed while causing the substrate holder 13 to rotate on its own axis, the effective permeability tends to increase when the magnetic field is applied in the track-width direction 11 compared to when the magnetic field is applied in the depth direction 12. In general, in terms of the performance of the finished magnetic head, it is preferable that the magnetic field be applied in the track-width direction 11 to increase the effective permeability, because better electro-magnetic conversion characteristics can be obtained.

However, in the case where the ferrite plate 1 is disposed on the substrate holder 13 as shown in FIG. 5, a film is formed in such a manner that its film thickness becomes thinner from the center of the substrate holder 13 toward the circumference thereof. As a result, the individual track defining portions of the ferrite plate 1 may have different track widths or electromagnetic conversion characteristics. During this time, since the substrate holder 13 is rotating on its axis, the film thickness can be easily made uniform in the direction of rotation (in the circumferential direction) of the substrate holder 13.

In contrast, in a case where the position of the ferrite plate 1 on the substrate holder 13 is made 90° different from the position shown in FIG. 5 so that the track-width direction 11 coincides with a rotational direction 16 of the substrate holder 13, the film thickness becomes approximately uniform in the track-width direction 11 and the track width of each track defining portion, therefore, becomes approximately uniform. However, if the ferrite plate 1 is disposed in the above-described manner, the effective permeability increases when the magnetic field is applied in the depth direction 12 compared to when the magnetic field is applied in the track-width direction 11, by the influence of the aforementioned magnetic anisotropy. As a result, the effective permeability of the track-width direction 11 that is needed in terms of the performance of the finished magnetic head becomes relatively small.

As described above, it has conventionally been impossible to increase the effective permeability relative to the track-width direction that is needed in terms of the performance of a magnetic head, nor to make uniform the track width of each track defining portion, i.e., each magnetic head, because of the limitations of the related-art manufacturing process described above.

SUMMARY OF THE INVENTION

It is, therefore, an object of the present invention to provide a magnetic-head manufacturing method capable of compatibly realizing good electromagnetic conversion characteristics and the uniform track width of each magnetic head in manufacturing a magnetic head in which magnetic metal thin films are respectively formed on opposed faces of a pair of magnetic core halves made of a magnetic oxide and abut against each other across a magnetic gap.

To achieve the above object, in accordance with the present invention, there is provided a method of manufacturing a magnetic head in which magnetic metal thin films are respectively formed on opposed faces of a pair of magnetic core halves made of a magnetic oxide and abut against each other across a magnetic gap. The method includes the steps of preparing an opposed-target type sputtering apparatus, holding a magnetic oxide block on a holding member, and forming, while rotating the holding member, the magnetic metal thin film on an end face of the magnetic oxide block which constitutes one of the opposed faces, in an argon gas containing any one of nitrogen, oxygen and carbon dioxide. A direction of rotation of the holding member is made substantially coincident with a track-width direction of the opposed face.

According to the aforesaid manufacturing method, the direction of rotation of the holding member which holds the magnetic oxide block and the track-width direction of the end face of the magnetic oxide block which constitutes one of the opposed faces are made approximately coincident with each other, so that the film thickness of the magnetic metal thin film formed on each track defining portion is approximately uniform and the track width of each manufactured head is also approximately uniform.

Even if the direction of rotation of the holding member and the track-width direction of the end face of the magnetic oxide block are made coincident with each other, since the magnetic metal thin film is formed in the argon gas containing any one of nitrogen, oxygen and carbon dioxide, it is also possible to achieve a sufficient value regarding an effective permeability relative to the track-width direction.

The above and other objects, features and advantages of the present invention will become apparent from the following detailed description of a preferred embodiment of the present invention, taken in conjunction with the accompanying drawings.

BRIEF DESCRIPTION OF THE DRAWINGS

FIG. 8 is a graphic representation showing the output-frequency characteristic of a magnetic head manufactured by the manufacturing method according to the embodiment of the present invention and the output-frequency characteristic of a magnetic head manufactured by performing sputtering in a pure Ar gas.

DETAILED DESCRIPTION OF THE PREFERRED EMBODIMENT

A preferred embodiment of the present invention will be described below with reference to the accompanying drawings.

Figure 1:
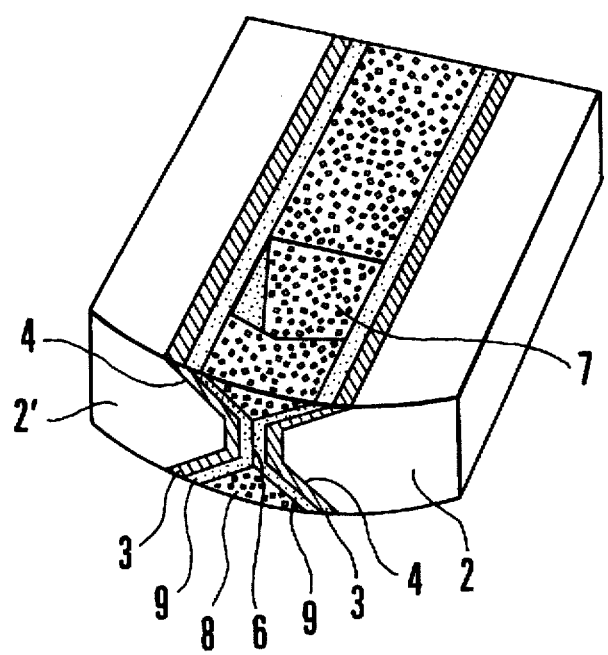
FIG. 1 is a diagrammatic perspective view of the magnetic core of a general MIG type of magnetic head.
Figure 2:
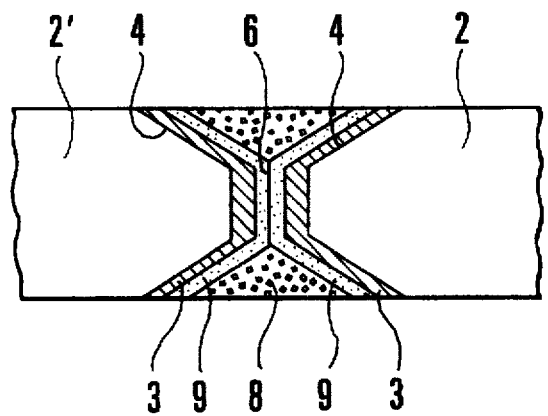
FIG. 2 is a diagrammatic perspective view showing the slide face of the magnetic core of FIG. 1 which is to be placed in sliding contact with a magnetic recording medium.
Figure 3A:
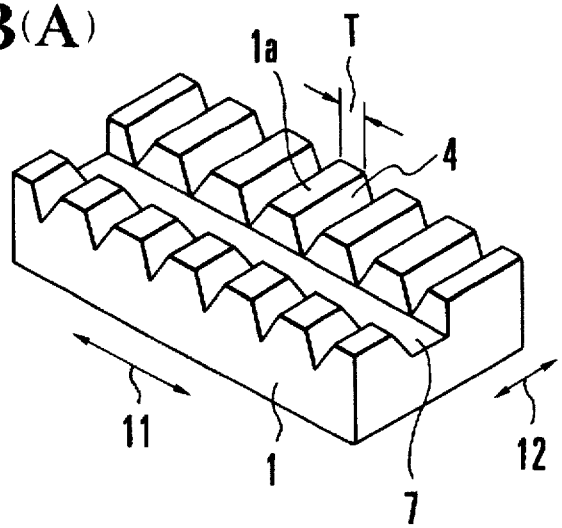
FIGS. 3(A), 3(B) and 3(C) are schematic views showing one example of a related-art method of manufacturing the magnetic core of the magnetic head shown in FIGS. 1 and 2.
Figure 3B:
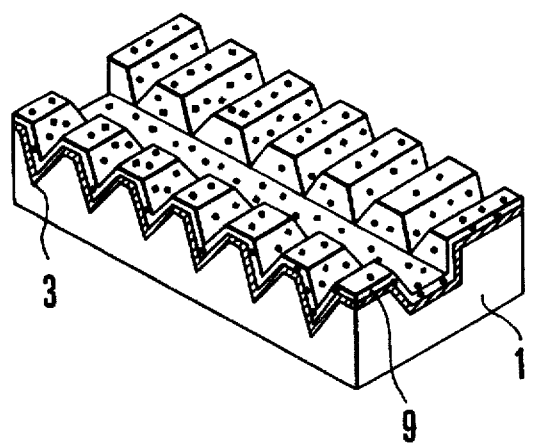
Figure 3C:
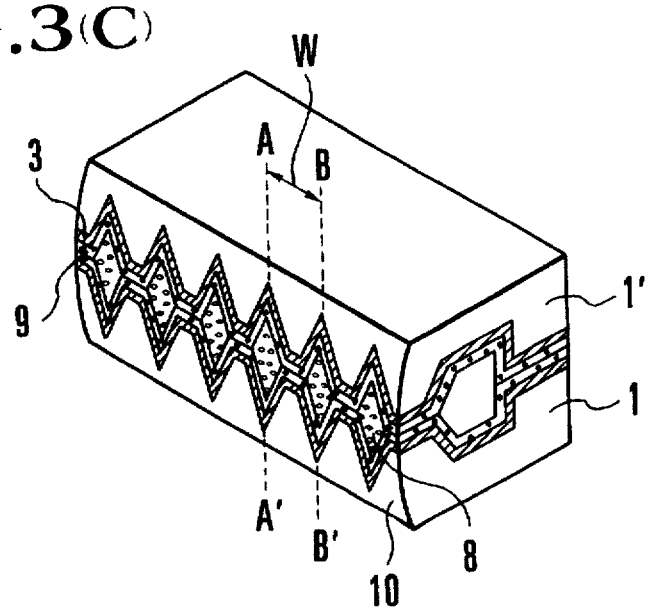
Figure 4:
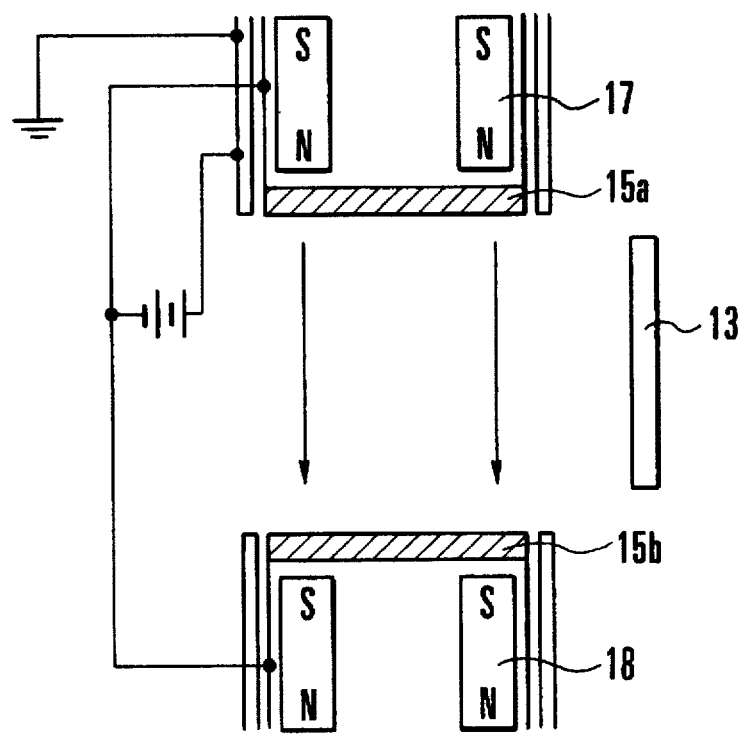
FIG. 4 is a schematic view showing one example of an opposed-target type sputtering apparatus.
Figure 5:
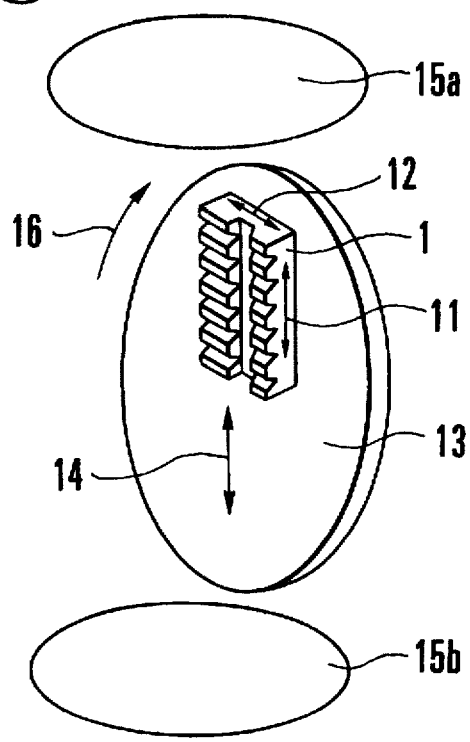
FIG. 5 is a schematic view showing one example of the arrangement of a ferrite plate and a substrate holder in the apparatus of FIG. 4.

A magnetic-head manufacturing method according to the preferred embodiment adopts a manufacturing process similar to that explained previously with reference to FIGS. 3(A), 3(B) and 3(C), except for the step of forming the magnetic metal thin film 3. Therefore, detailed description of the manufacturing process is omitted.

Figure 6:
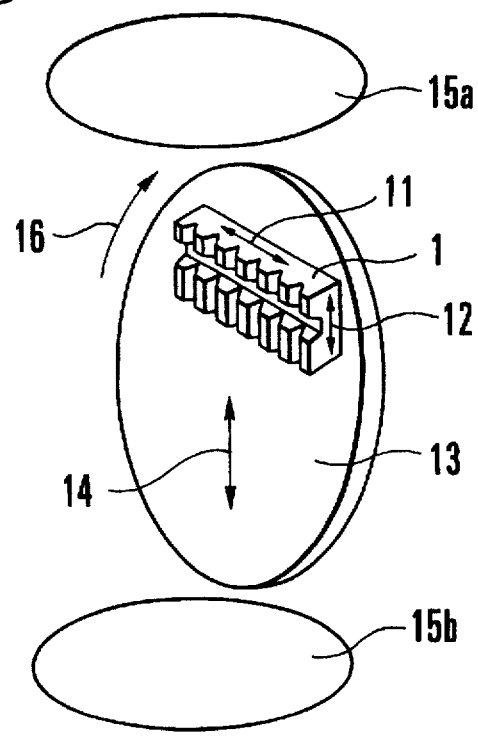
FIG. 6 is a schematic view which serves to explain a film forming step in the magnetic-head manufacturing method according to one embodiment of the present invention.

A step of forming a magnetic metal thin film according to the present embodiment will be described below. FIG. 6 is a view which serves to explain the film forming step of the manufacturing process according to the present embodiment, and shows the arrangement of one pair of targets 15a and 15b, a substrate holder 13 and a ferrite plate 1 in an opposed-target type sputtering apparatus.

As shown, the targets 15a and 15b each made of a magnetic metal material such as a Fe-Al-Si based alloy, are opposed to each other, and the substrate holder 13 is disposed for rotation on its axis at a location along the circumference of each of the targets 15a and 15b. As is apparent from FIG. 6, the ferrite plate 1 on which to form a magnetic metal film is fixedly disposed on the substrate holder 13 in such a manner that a track-width direction 11 of the abutment faces (film forming face) of the ferrite plate 1 coincides with a rotational direction (circumferential direction) 16 of the substrate holder 13. It is to be noted that, by disposing the ferrite plate 1 at a location as close as possible to the circumference of the substrate holder 13, it is possible to eliminate the influence of a circumferential speed error in the radial direction of the substrate holder 13.

A sputtering method used in the manufacturing method according to the present embodiment will be described below. In the following description of the sputtering method according to the present embodiment, reference will be made to a well-known Fe-Al-Si based alloy as a magnetic metal material.

The composition of each Fe-Al-Si based alloy target used in the present embodiment was $Fe_{84.0}$, $Al_{6.0}$ and $Si_{10.0}$ (% by weight).

The opposed-target type sputtering apparatus was used to perform sputtering in a mixture of an Ar (argon) gas and an $N_2$ (nitrogen) gas with the Fe-Al-Si based alloy targets under sputtering conditions to be described later. It has been found preferable from experiments that the amount of $N_2$ to be mixed with the Ar gas be selected to be approximately 0.5–5.0% (in volume ratio).

The sputtering conditions were an electrical power of 3 kW, a target-to-target distance of 140 mm, a target-to-substrate distance of 120 mm, a substrate heating temperature in the range of 200°–230° C., a gas pressure of 7 mTorr, and a film thickness of approximately 5 μm.

Figure 7:
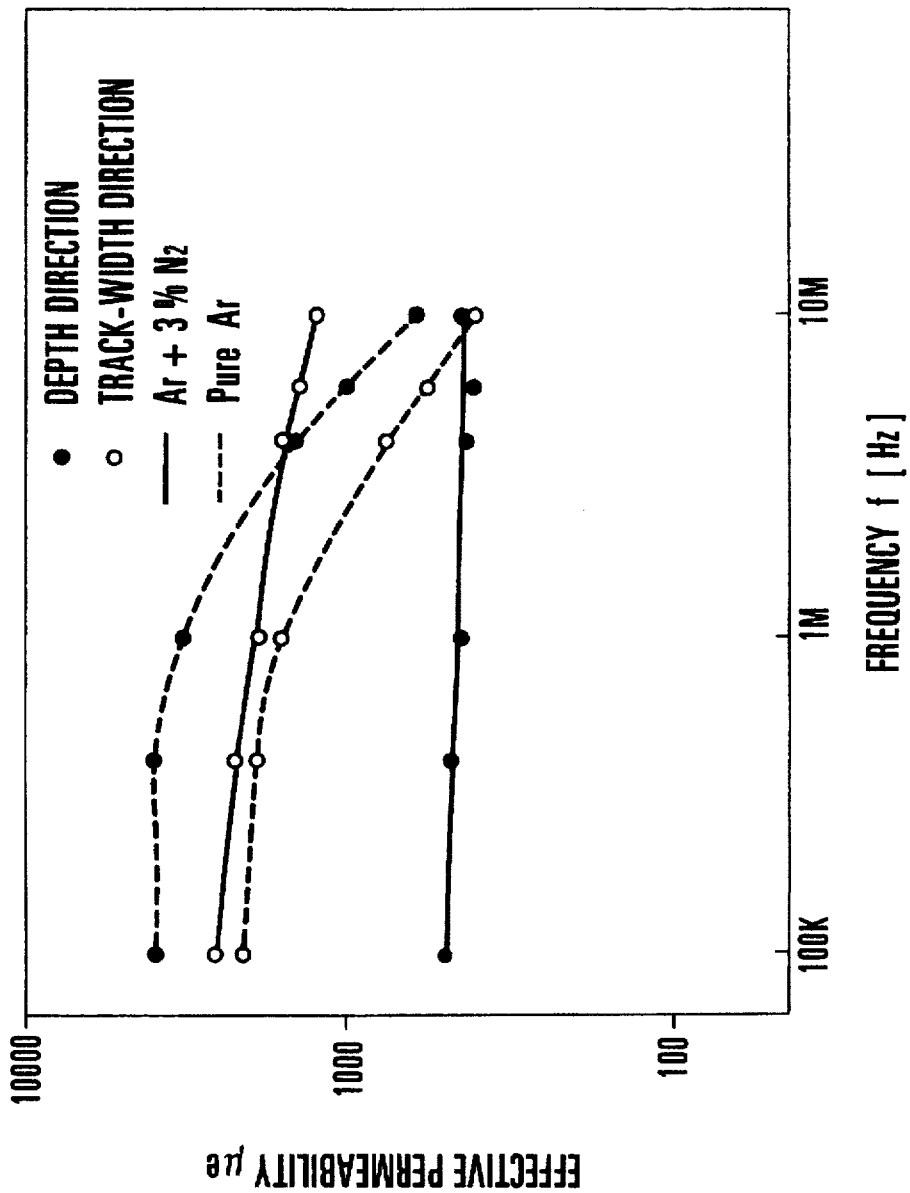
FIG. 7 is a graphic representation showing the frequency dependence of the effective permeability of a Fe-Al-Si based alloy film obtained by sputtering based on the manufacturing method according to the embodiment of the present invention and the frequency dependence of the effective permeability of a Fe-Al-Si based alloy film obtained by related-art sputtering using no mixture of argon and nitrogen.

FIG. 7 shows the frequency dependence of the effective permeability of the Fe-Al-Si based alloy film which was obtained by performing sputtering in a mixture of an Ar gas and a 3% $N_2$ and the frequency dependence of the effective permeability of the Fe-Al-Si based alloy film which was obtained by performing sputtering in a pure Ar gas. In this magnetic-characteristic evaluation, each of the films was formed on a crystalline glass substrate by sputtering and the obtained film was heated at 560° C. for one hour, and the effective permeability of the film was measured.

In FIG. 7 which shows specific results selected from among the results of this experiment, each solid line represents a variation in the effective permeability of the Sendust film obtained by performing sputtering in the mixture of the Ar gas and the 3% $N_2$ gas, while each dashed line represents a variation in the effective permeability of the Sendust film obtained by performing sputtering in the pure Ar gas. In FIG. 7, each white dot represents the measurement result of an effective permeability relative to the track-width direction, while each black dot represents the measurement result of an effective permeability relative to the depth direction.

It is clearly understood from FIG. 7 that the effective permeability of the Fe-Al-Si based alloy film obtained by performing sputtering in the pure Ar gas is larger when a magnetic field is applied in the depth direction 12 than when a magnetic field is applied in the track-width direction 11. In contrast, in the case of the effective permeability of the Fe-Al-Si based alloy film obtained by performing sputtering in the mixture of the Ar gas and the 3% $N_2$ gas, it is understood that the effective permeability is larger when a magnetic field is applied in the track-width direction 11 than when a magnetic field is applied in the depth direction 12. Although no definite reason for this phenomenon has yet been discovered, it is to be noted that no grain boundary was observed in a cross section of the $N_2$-containing Fe-Al-Si based alloy film which was taken in the track-width direction 11, whereas grain boundaries were observed in a cross section of the $N_2$-containing the Fe-Al-Si based alloy film which was taken in the depth direction 12. From this finding, it is considered that since the Fe-Al-Si based alloy film grew in the track-width direction 11 in which no grain boundary was observed, the uniformity of the Fe-Al-Si based alloy film was favorably established in the track-width direction 11. Accordingly, it is considered that, because of the uniformity of the Fe-Al-Si based alloy film, a magnetic flux was able to easily flow so that the larger effective permeability was obtained in the depth direction 12. Incidentally, in the case of sputtering in the pure Ar gas, grain boundaries were observed in the cross section taken in the track-width direction 11, whereas no grain boundary was observed in the cross section taken in the depth direction 12.

In the case of the sputtering in the pure Ar gas, the degradation of the effective permeability due to an eddy current core loss occurred in a high-frequency band of not less than 1 MHz. However, in the case of the sputtering in the mixture of the Ar gas and the 3% $N_2$ gas, such degradation was not so serious, i.e., the degradation of the effective permeability in the high-frequency band was reduced and the electromagnetic characteristic was improved.

FIG. 8 is a graphic representation showing the output-frequency characteristic of a magnetic head manufactured by the above-described manufacturing method according to the preferred embodiment of the present invention and the output-frequency characteristic of a magnetic head manufactured by performing sputtering in the pure Ar gas.

As can be seen from FIG. 8, by adopting the Fe-Al-Si based alloy film sputtering method according to the present embodiment, it was possible to realize a magnetic head having a high electromagnetic conversion output compared to the related-art magnetic head. Accordingly, it will be understood that a good effect was provided by the increase in the effective permeability when the magnetic field is applied in the track-width direction 11. Further, it will be understood that an improvement in head output was achieved for approximately 1 dB at 7 MHz and for approximately 2 dB at 10 MHz owing to the improvement in the effective permeability in the high-frequency range provided by the sputtering in the mixture of the Ar gas and the 3% $N_2$ gas.

It is to be noted that if the sputtering conditions or the composition of the Fe-Al-Si based alloy is somewhat altered from the above-described examples, similar advantages and effects can be achieved.

As described above, in the magnetic-head manufacturing method according to the present embodiment, an opposed-target type sputtering apparatus is employed, and a magnetic oxide block is held on a holding member and, while the holding member is being rotated, a magnetic metal thin film is formed on end faces of the magnetic oxide block, which serve as abutment faces, in an argon gas which contains nitrogen. Further, the direction of rotation of the holding member and the track-width direction of the abutment faces are made approximately coincident with each other. Accordingly, the film thickness of the magnetic metal thin film formed on each track defining portion is approximately uniform, and the track width of each manufactured head is also approximately uniform. Further, since the magnetic metal thin film is formed in the argon gas which contains nitrogen, it is possible to achieve a sufficient value regarding the effective permeability relative to the track-width direction.

Incidentally, even in the case of sputtering using an argon gas which contains not nitrogen but approximately 0.5–5% oxygen or carbon dioxide, it was possible to achieve advantages and effects which were somewhat different but substantially similar.

What is claimed is:

1. A method of manufacturing a magnetic head in which magnetic metal thin films are respectively formed on opposed faces of a pair of magnetic core halves made of a magnetic oxide and abut against each other across a magnetic gap, comprising the steps of:

preparing an opposed-target sputtering apparatus;

providing a magnetic oxide block for forming a magnetic core half, the block having a face on which a magnetic gap of said magnetic core half is to be formed and wherein said step of preparing comprises a step of placing the magnetic oxide block between opposed targets in a parallel manner;

providing the magnetic gap with a track-width direction;

holding said magnetic oxide block on a holding member and selecting a disposition thereon for said magnetic oxide block and a rotation direction for said holding member such that said track-width direction is substantially tangential to said rotating direction;

rotating said magnetic oxide block between said opposed targets; and while rotating said holding member in said selected rotation direction, sputtering a magnetic metal thin film on said face of the magnetic oxide block in an argon gas containing any one of nitrogen, oxygen and carbon dioxide.

2. A method according to claim 1, wherein any one of the nitrogen, the oxygen and the carbon dioxide is contained in the argon gas in a gaseous state.

3. A method according to claim 2, wherein any one of the nitrogen, the oxygen and the carbon dioxide contained in the argon gas occupies a percent of approximately 0.5–5% of the total volume of at least one of the gases of nitrogen, oxygen and carbon dioxide and the argon gas.

4. A method according to claim 3, wherein the argon gas contains approximately 3% nitrogen of the total volume of the argon gas and the nitrogen.

5. A method according to claim 1, wherein each of the targets is a Fe-Si-Al based alloy.

6. A method according to claim 5 wherein the Fe-Si-Al based alloy is Sendust alloy.

7. A method according to claim 1, wherein the magnetic oxide block is disposed at a position most distant from a rotational center of the holding member on a straight line passing through the rotational center.

* * * * *

UNITED STATES PATENT AND TRADEMARK OFFICE
CERTIFICATE OF CORRECTION

PATENT NO. : 5,718,812
DATED : February 17, 1998
INVENTOR(S) : Takaoka, Satoshi

It is certified that error appears in the above-identified patent and that said Letters Patent is hereby corrected as shown below:

Col. 8, line 31, delete "Sendust alloy" and insert -- $Fe_{84.0}$, $Al_{6.0}$ and $Si_{10.0}$ --.

Signed and Sealed this

Eighth Day of September, 1998

Attest:

BRUCE LEHMAN

*Attesting Officer*   *Commissioner of Patents and Trademarks*